United States Patent
Fukuyo et al.

(10) Patent No.: US 6,755,948 B1
(45) Date of Patent: Jun. 29, 2004

(54) TITANIUM TARGET FOR SPUTTERING

(75) Inventors: Hideaki Fukuyo, Ibaraki (JP); Yuichiro Shindo, Ibaraki (JP); Hideyuki Takahashi, Ibaraki (JP)

(73) Assignee: Nikko Materials Company, Limited, Tokyo (JP)

( * ) Notice: Subject to any disclaimer, the term of this patent is extended or adjusted under 35 U.S.C. 154(b) by 102 days.

(21) Appl. No.: 10/089,626

(22) PCT Filed: Oct. 24, 2000

(86) PCT No.: PCT/JP00/07411

§ 371 (c)(1),
(2), (4) Date: Apr. 1, 2002

(87) PCT Pub. No.: WO01/38598

PCT Pub. Date: May 31, 2001

(30) Foreign Application Priority Data

Nov. 22, 1999 (JP) .......................................... 11-331073

(51) Int. Cl.$^7$ .......................... C23C 14/00; C25B 11/00
(52) U.S. Cl. .............................. 204/298.13; 204/298.12; 148/421; 420/417
(58) Field of Search ...................... 204/298.12, 298.13; 420/417; 148/421

(56) References Cited

U.S. PATENT DOCUMENTS

| | | | |
|---|---|---|---|
| 4,793,854 A | 12/1988 | Shimotori et al. ............ 75/10.1 |
| 4,891,066 A | 1/1990 | Shimotori et al. ............. 75/84 |
| 5,196,916 A | * 3/1993 | Ishigami et al. ............. 257/769 |
| 5,204,057 A | 4/1993 | Ishigami et al. ............. 420/417 |
| 6,045,634 A | * 4/2000 | Annavarapu ................ 148/671 |
| 6,309,595 B1 | * 10/2001 | Rosenberg et al. ......... 420/417 |
| 6,596,228 B2 | * 7/2003 | Rosenberg et al. ......... 420/417 |

FOREIGN PATENT DOCUMENTS

| | | |
|---|---|---|
| EP | 0 408 383 A1 | 1/1991 |
| JP | 62-280335 | 12/1987 |
| JP | 06-280009 | 10/1994 |
| JP | 07-240391 | 9/1995 |
| JP | 10-008245 | 1/1998 |
| JP | 11-229130 | 8/1999 |

OTHER PUBLICATIONS

Umeki Takenori, "Sputtering Target", *Toshiba Technical Bulletin*, Publication No. 95–5786, vol. 13–79, pp. 43–46, Oct. 1995 (includes a one page English language abstract).
Patent Abstracts of Japan, English Abstract of JP 06–280009.
Patent Abstracts of Japan, English Abstract of JP 10–008245.

* cited by examiner

*Primary Examiner*—John P Sheehan
(74) *Attorney, Agent, or Firm*—Howson and Howson

(57) ABSTRACT

A titanium sputtering target that contains a concentration of oxygen in an amount of 20 ppm or less and has a maximum grain diameter of 20 μm or less. The target permits a sputtering operation to be accomplished substantially free from the formation of particles or the occurrence of an abnormal discharge phenomenon. In addition, the target contains a reduced amount of contaminants and is soft.

4 Claims, 2 Drawing Sheets

TITANIUM TARGET FOR SPUTTERING

FIELD OF THE INVENTION

The present invention relates to a high-quality titanium target for sputtering capable of significantly reducing the impurity concentration of gas components such as oxygen, nitrogen and hydrogen contained in the titanium target for sputtering, and effectively suppressing the formation of particles upon deposition.

The impurity concentration of gas components such as oxygen, nitrogen and hydrogen described in the present specification will be displayed in mass% in all cases.

BACKGROUND OF THE INVENTION

In recent years, various electronic devices have been devised beginning with the exponential advancement of semiconductors, and the improvement of such functions as well as the development of new devices are being sought on a daily basis.

Under these circumstances, there is an inclination toward the miniaturization of electronic devices and equipment and increase in the degree of integration thereof. Numerous thin films are formed during the manufacturing process of many of such devices and equipment, and titanium, from its unique metallic property, is used in the formation of thin films of various electronic devices as titanium and its alloy film, titanium silicide film, or titanium nitride film.

Upon forming such titanium (including metal alloys and compounds) films, attention must be given to the fact that the titanium film itself requires a high degree of purity.

The thin films used in semiconductors and the like are made even thinner, shorter and smaller, and, since the mutual distance thereof is extremely small and the integration density is being improved, there is a problem in that the substance forming the thin film or the impurities contained in such thin film will diffuse to the adjacent thin films. This will result in the off-balance of the constituents of the original film and the adjacent films, and there is a significant problem in that the primary function of the film will deteriorate.

In the manufacturing process of this type of thin film, there are cases where the application of heat reaches several hundred degrees, and the temperature also rises during the use of electronic devices equipped with semiconductor devices. This kind of rise in temperature further increases the diffusion speed of the aforementioned substances, and will result in a significant problem where the functions of the electronic devices will deteriorate.

Moreover, generally speaking, the aforementioned titanium and its alloy film, titanium suicide film or titanium nitride film can be formed with a physical deposition method such as sputtering or vacuum deposition. Explained below is the sputtering method which is used most comprehensively among the above. This sputtering method is a method of physically colliding a positive ion such as Ar$^+$ to a target disposed on a cathode and releasing the metal atoms constituting the target with the collision energy thereof.

Nitride may be formed by using titanium or its alloy (TiAl alloy, etc.) as the target and conducting sputtering under a mixed gas atmosphere of argon gas and nitrogen.

When impurities exist in the titanium (including alloys and compounds) target upon forming this sputtering film, coarsened particles floating in the sputtering chamber reach the substrate and cause disconnection or short circuit of the thin film circuit, increase the formation amount of particles that cause protrusions on the thin films, and, during sputtering in which gas components such as oxygen, hydrogen and nitrogen exist, cause abnormal electrical discharge thought to be caused by the outburst of such gases. Thus, there is a problem in that a uniform film cannot be formed.

Due to the forgoing problems, it goes without saying that it is necessary to reduce conventional impurities such as transition metal, high melting point metal, alkali metal, alkaline earth metal or other metals. Nevertheless, the aforementioned particles are formed even when decreasing the elements thereof as much as possible, and the current status is that the fundamental solution for such problems is yet to be discovered.

Furthermore, although there are cases where the titanium thin film is used as a pasting layer for preventing the formation of particles upon forming a titanium nitride Ti—N film, the film is hard and sufficient adhesive strength could not be obtained, nor would it function as a pasting layer since it would peel off from the inner wall of the film-forming equipment or its components. Thus, there is a problem in that this would cause the formation of particles.

OBJECTS OF THE INVENTION

An object of the present invention is to overcome the various foregoing problems, and particularly to provide a titanium target for sputtering free from the formation of particles or occurrence of abnormal discharge phenomenon, having a reduced content of contaminants, and which is soft.

SUMMARY OF THE INVENTION

The present invention provides 1) a titanium target for sputtering wherein the oxygen contained in the titanium target for sputtering is 20 ppm or less and the average grain diameter of such target is 20 µm or less; 2) a titanium target for sputtering wherein the impurity concentration of gas components such as oxygen, nitrogen and hydrogen contained in the titanium target is 20 ppm or less; 3) a titanium target for sputtering according to 1) or 2) above, wherein the Vickers hardness (Vs) is 120 or less; and 4) a titanium target for sputtering according to any one of 1) to 3) above, wherein the total content of alkali metal and alkaline earth metal such as Na and K is 5 ppm or less, the total content of heavy metal and light metal is 10 ppm or less, and the total content of radioactive elements such as U and Th of 1 ppb or less.

DETAILED DESCRIPTION OF THE PREFERRED EMBODIMENT

Figure 1:
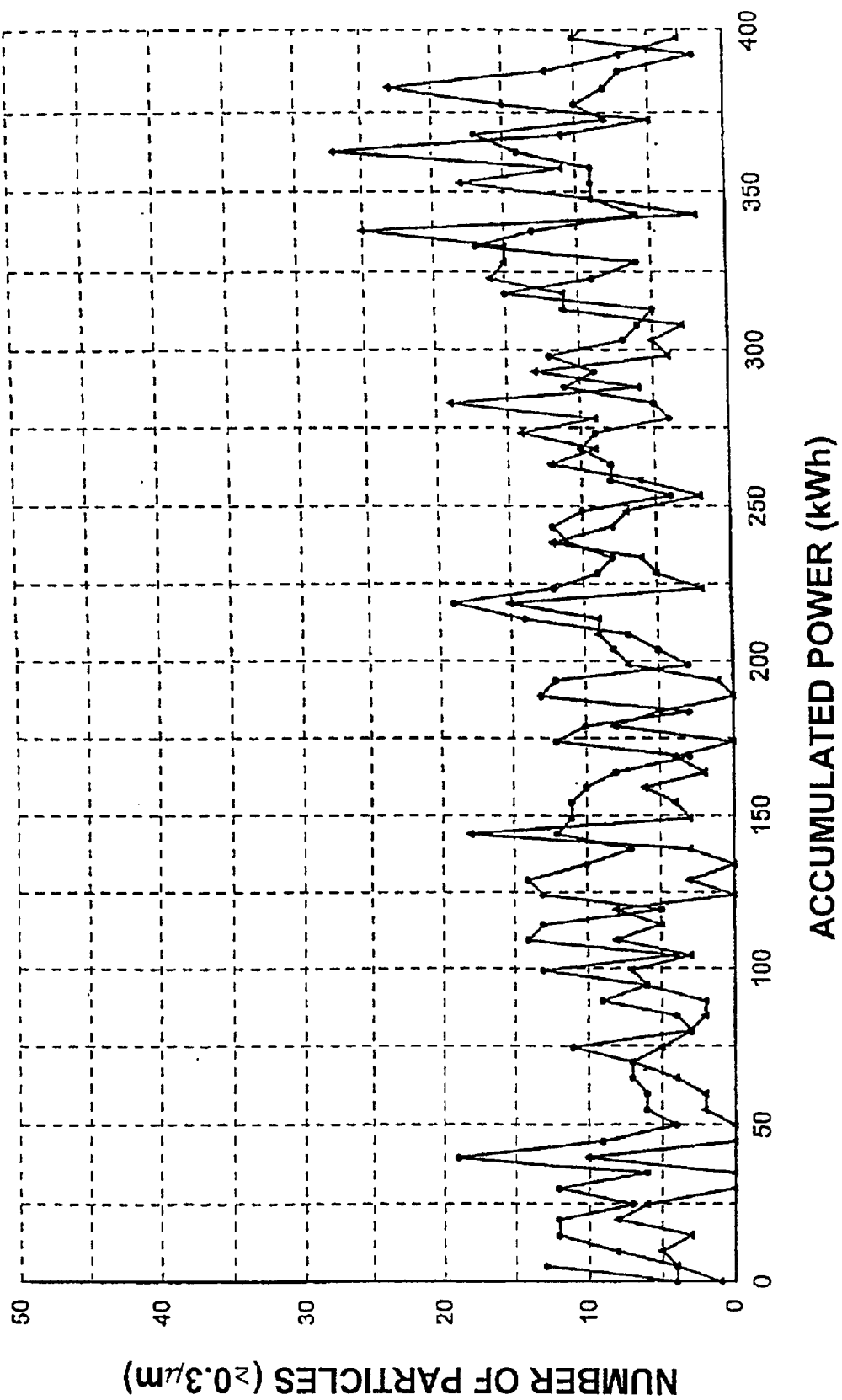
FIG. 1 is a correlation diagram showing the accumulated power and formation status of particles of the Example.

With the titanium target for sputtering of the present invention, the oxygen contained in the target is 20 ppm or less, and the maximum grain diameter of the target is 20 µm or less. When the contained oxygen exceeds 20 ppm and the maximum grain diameter of the target exceeds 20 µm, as described later, the formation of particles will increase gradually pursuant to the progress of sputtering.

Conventionally, since there is an inclination for the grain diameter to become coarser when reducing the oxygen content, attempts were not made for precisely adjusting the two. Nevertheless, in the present invention, it was discovered that the reduction of oxygen content and the prevention of grain diameter coarsening are particularly effective in preventing the formation of particles.

Moreover, since gas components such as nitrogen and hydrogen other than oxygen existing on the titanium target show similar behavior as oxygen, it is preferable that the total amount of impurity concentration of gas components such as oxygen, nitrogen and hydrogen be 20 ppm or less.

Further, when the impurity concentration of gas components such as oxygen, nitrogen and hydrogen is 20 ppm or less, the vickers hardness (Vs) is 120 or less, and a soft film may be formed. By way of reference, the Vickers hardness (Vs) of an ordinary high-purity titanium target is 150, and a considerable fall in hardness can be acknowledged.

Upon manufacturing high-purity titanium, during fused salt electrolysis, it is necessary to sufficiently dry (vacuum drying and dehydration at 300° C. or higher) the salt to be used, and to further store the raw materials and the like under a dry atmosphere.

In addition, the atmosphere during fused salt electrolysis is made into an inert atmosphere such that the outside air will not flow in. If possible, this process should be carried out under an atmosphere wherein the humidity is 30% or less since there is fear of air being mixed in at the time of opening and closing the valve during the extraction of electro-deposited Ti.

Further, during electrolysis, the process is carried out upon making the initial cathode current density $0.6A/cm^2$ or less, which is a low current density. It is thereby possible to obtain an electro-deposited Ti having an oxygen amount of 20 ppm or less.

The electrolysis temperature is set to 600 to 800° C. If the temperature is less than 600° C., the electro-deposited Ti will become sponge-like, and oxygen will increase. Meanwhile, if the temperature exceeds 800° C., deterioration of crucible materials or the like and evaporation of salt will become more frequent, and productivity will worsen.

Moreover, it is preferable that the electro-deposited Ti obtained from the raw materials is 80% (yield) or less. If the percentage is any higher, this will cause the increase of impurities such as oxygen.

The electro-deposited Ti obtained there by is cleansed with purified water (acid cleaning it not preferable as the surface will become oxidized), and, after drying, it is stored in a vacuum or under an inert atmosphere, thereafter pressed under a dry atmosphere, and is further EB (electron beam) dissolved. It is thereby possible to avoid significant increase of oxygen at the time of EB dissolution and to suppress the amount to 20 ppm or less.

Next, a billet is prepared by performing hot plastic processing such as hot forging or hot extrusion at 700° C. or higher in which dynamic re-crystallization occurs, preferably between 800° C. and 950° C., to the EB dissolved ingot having an oxygen concentration of 20 ppm or less and to which precise component control has been conducted, in order to break down the unevenness of such ingot and the coarsened cast structure and to make them even and minute.

Cold plastic deformation such as cold forging or cold extrusion is repeatedly implemented to the billet obtained as described above, and, by applying strong deformation to the billet, the crystalline structure of the target ultimately becomes an even and minute structure of 20 $\mu$m or less.

Then, this billet is cut in order to prepare performs corresponding to the target volume. Cold plastic processing such as cold forging or cold extrusion is further performed to these performs in order to apply strong deformation and to process the target into a discoid shape or the like.

Moreover, heat treatment at 400 to 500° C. is performed for a short period of time to the target having a processing structure accumulated with such strong deformation upon rapidly raising the temperature by using a fluidized bed furnace or the like. A target having a minute re-crystallized structure of 20 $\mu$m or less is thereby obtained.

EXAMPLE

Next, an example of the present invention is explained. The present example is merely an example and this invention shall not be limited thereto. In other words, modes or modifications other than the examples included in the scope of technical ideas of the present invention shall be covered in their entirety.

Upon manufacturing high-purity titanium, a chloride bath of sodium chloride (NaCl)-potassium chloride (KCl) was foremost used as the electrolytic bath.

Prior to the use of this electrolytic bath, sufficient vacuum, drying and dehydration were conducted at 500° C. for 20 hr. Nickel abundant in corrosion resistance was used for the electrolysis vessel and its peripheral equipment in order to avoid mix-in of impurities and to prevent contamination.

Electrolysis was performed at an electrolysis temperature of 740° C., cathode initial current density of $0.3A/cm^2$, and under an Ar atmosphere.

The electro-deposited Ti obtained thereby was cleansed with purified water and, after drying and dehydration, pressed under an atmosphere wherein the humidity is 10% or less.

After the above, electron beam dissolution is performed thereto. Although alkali metal elements will increase due to fused salt electrolysis, this will not be a particular problem since they can be considerably reduced with this electron beam dissolution. Moreover, this will also significantly reduce impurities of gas components such as hydrogen. Since it is necessary to suppress the increase of oxygen as much as possible in this process, this process is performed under a high vacuum.

Radioactive elements U and Th will become condensed in the bath during electrolysis, and will further decrease as impurities of electro-deposited titanium. Next, the EB dissolved ingot was forged and rolled, and rapid heat treatment was performed at 400 to 500° C.

Pursuant to the precise component control in the foregoing process, the concentration of oxygen became 20 ppm or less, and the average grain diameter of the material became 20 $\mu$m or less. After processing this into a target shape, sputtering was performed with an actual production machine, and the accumulated power and the formation of particles were observed.

The results are shown in FIG. 1. Particles on an 8-inch wafer and of 0.3 $\mu$m or more were counted.

Although the formation of particles increased slightly from the initial stages of sputtering up to the accumulated power reaching 400 kWh, it is clear that the formation of particles has been suppressed and that the state of transition did not change very much. The formation of particles was effectively suppressed by controlling both the oxygen concentration and the grain diameter.

Comparative Example 1

Figure 2:
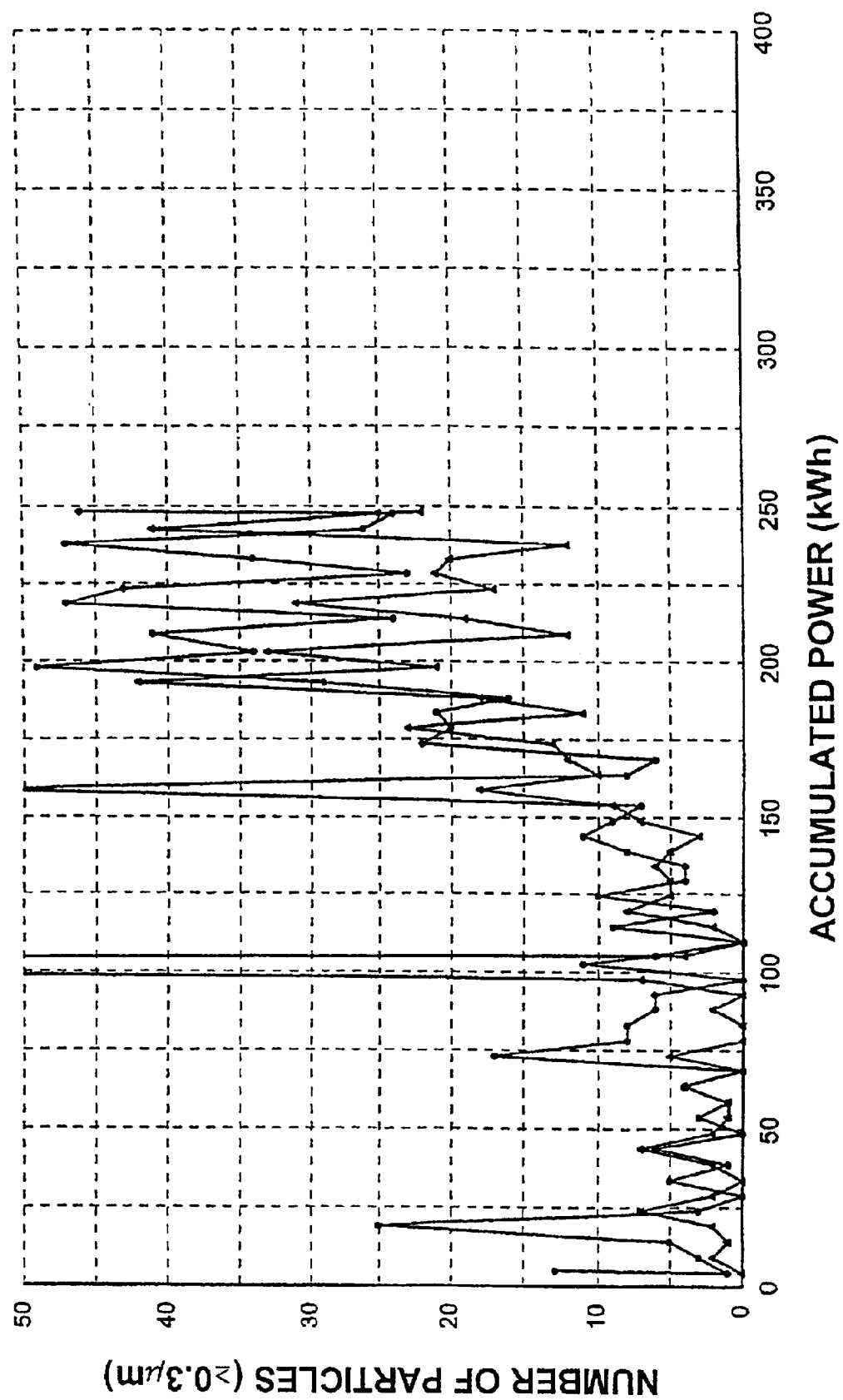
FIG. 2 is a correlation diagram showing the accumulated power and formation status of particles of Comparative Example 1.

Next, a sputtering target having an oxygen content of 200 ppm and in which the maximum grain diameter of the target is 100 μm was used, sputtering was performed thereto similarly with an actual production machine, and the accumulated power and formation of particles were observed. The results are shown in FIG. 2.

Although the particles were comparatively suppressed low from the initial stages of sputtering up to the accumulated power reaching 150 kWh, sudden burst of particles formation was observed in several places. The formation of particles increased rapidly up to 250 kWh thereafter and also became unstable.

Comparative Example 2

A sputtering target having oxygen content of 30 ppm and in which the maximum grain diameter of the target is 15 μm was used, sputtering was performed thereto similarly with an actual production machine as in Example 1, and the accumulated power and formation of particles were observed.

The particles were suppressed low from the initial stages of sputtering up to the accumulated power reaching 150 kWh, and sudden burst of particles formation was not observed. The formation of particles increased gradually from the vicinity of 300 kWh thereafter, and exceeded the standard upper limit of particles, which are 30 particles of 0.3 μm or more, at 300 kWh.

Comparative Example 3

A sputtering target having oxygen content of 10 ppm and in which the maximum grain diameter of the target is 100 μm was used, sputtering was performed thereto similarly with an actual production machine as in Example 1, and the accumulated power and formation of particles were observed.

Although the particles were comparatively suppressed low from the initial stages of sputtering up to the accumulated power reaching 250 kWh, sudden formation of particles was observed in several places along the way. The formation of particles increased gradually after the sudden formation of particles in the vicinity of 250 kWh, and exceeded the standard upper limit of particles, which is 30 particles of 0.3 μm or more, at 300 kWh.

As described above, a phenomenon of significant formation of particles was observed due to the increase of oxygen and coarsening of grains. In particular, numerous formations of particles were observed when the grain diameter becomes large based on the coarsened titanium grains during sputtering.

Provided is a titanium target for sputtering effective in forming thin films of electronic devices and the like having an advantageous characteristic of being able to considerably reduce the number of particles formed during sputtering by performing sputtering with a high-purity titanium target capable of significantly reducing the impurity concentration of gas components such as oxygen, nitrogen and hydrogen and having a maximum grain diameter of 20 μm or less.

What is claimed is:

1. A titanium target for sputtering comprising a titanium sputtering target in which an impurity concentration of gas components including oxygen, nitrogen and hydrogen contained in the titanium target is 20 ppm or less, and said target has a Vickers hardness (Vs) of 120 or less.

2. A titanium sputtering target according to claim 1, wherein said target has a total content of alkali metals and alkaline earth metals including Na and K of 5 ppm or less, a total content of heavy metals and light metals of 10 ppm or less, and a total content of radioactive elements including U and Th of 1 ppb or less.

3. A titanium sputtering target according to claim 1, wherein said target has an average grain diameter of 20 μm or less.

4. A titanium sputtering target according to claim 2, wherein said target has an average grain diameter of 20 μm or less.

* * * * *